United States Patent [19]

Hamasaki

[11] Patent Number: 5,335,008

[45] Date of Patent: Aug. 2, 1994

[54] IMAGER WHICH HAS A LOAD TRANSISTOR CONNECTED TO EACH VERTICAL SIGNAL LINE AND WHEREIN EACH LOAD TRANSISTOR COMPRISES TWO FIELD TRANSISTORS CONNECTED IN SERIES

[75] Inventor: Masaharu Hamasaki, Kanagawa, Japan

[73] Assignee: Sony Corporation, Tokyo, Japan

[21] Appl. No.: 848,129

[22] Filed: Mar. 9, 1992

[30] Foreign Application Priority Data

Mar. 8, 1991 [JP] Japan .................. 3-069341

[51] Int. Cl.$^5$ ............................................. H04N 3/14
[52] U.S. Cl. ...................... 348/301; 348/308
[58] Field of Search .............. 358/212, 213.15, 213.11, 358/213.26, 213.27; 307/33, 31, 36

[56] References Cited

U.S. PATENT DOCUMENTS

| | | | |
|---|---|---|---|
| 4,068,148 | 1/1978 | Nomiya et al. .................. 307/33 |
| 4,274,113 | 6/1981 | Ohba et al. .................. 358/212 |
| 4,300,163 | 11/1981 | Wada et al. .................. 358/213.15 |
| 4,577,231 | 3/1986 | Ohba et al. .................. 358/213.26 |
| 4,680,476 | 7/1987 | Berger et al. .................. 358/213.26 |
| 4,831,451 | 5/1989 | Hynecek .................. 358/213.26 |
| 4,959,723 | 9/1990 | Hashimoto .................. 358/213.26 |
| 5,086,344 | 2/1992 | D'Luna et al. .................. 358/213.15 |

*Primary Examiner*—Joseph Mancuso
*Assistant Examiner*—Wendy R. Greening
*Attorney, Agent, or Firm*—Hill, Steadman & Simpson

[57] ABSTRACT

The present invention is directed to a CCD image sensing device in which an amplifying transistor for amplifying a photoelectrically-converted signal charge and outputting the amplified signal charge to a vertical signal line is provided at every pixel of a plurality of pixels arrayed in a two-dimensional fashion and a load transistor is connected to each of the vertical signal lines, in which the load transistor is composed of a first field effect transistor having a constant current characteristic and a second field effect transistor acting as a negative feedback resistor function connected in series.

6 Claims, 2 Drawing Sheets

IMAGER WHICH HAS A LOAD TRANSISTOR CONNECTED TO EACH VERTICAL SIGNAL LINE AND WHEREIN EACH LOAD TRANSISTOR COMPRISES TWO FIELD TRANSISTORS CONNECTED IN SERIES

CROSS-REFERENCES TO RELATED APPLICATIONS

This application is related to my copending application entitled: "Solid State Imager Which Reduces Noise And Improves The Sensitivity", Ser. No. 07/776,212, filed Oct. 15, 1991 which will issue as U.S. Pat. No. 5,187,583 on Feb. 16, 1993.

BACKGROUND OF THE INVENTION

1. Field of the Invention

The present invention generally relates to CCD (charge-coupled device) image sensing devices and, more particularly, is directed to an amplifying type CCD or solid state image sensing device in which an amplifying element is provided at every pixel (picture element).

2. Description of the Related Art

Of solid state image sensors, particularly in CCD solid state image sensing devices, a signal charge stored in a photoelectric converting section of each pixel in response to an incident light is transferred by using the CCD to an output section in the form of electric charge. It is frequently observed that, during the time that the electric charges are transferred by the CCD, a noise component is mixed into the signal charges, thus resulting in the signal-to-noise ratio (S/N ratio) being deteriorated.

As a CCD solid state image sensing device proposed in order to remove the aforesaid disadvantage, an amplifying type CCD solid state image sensing device is known, in which a photosensor section comprised of a photoelectric converting section for storing a signal charge in response to an incident light, an amplifying MOS (metal oxide semiconductor) transistor for amplifying the signal charges stored in the photoelectroc converting section to output the signal charge thus amplified to a vertical signal line and reset means for resetting the input of the amplifying MOS transistor is provided at every pixel of a plurality of pixels arrayed in a two-dimensional fashion (e.g., see Japanese Laid-Open Patent Publication No. 1-154678). In this amplifying type solid state image sensing device, the amplifying MOS transistor is provided at every pixel and one load MOS transistor is connected to each vertical signal line.

The vertical signal lines are constructed by the pattern wiring process of aluminum wire or the like. In order to increase the aperture ratio of the image sensing device, it is desired that this vertical signal line is formed as thin as possible. However, if the vertical signal line is too thin, then a voltage drop occurs within the vertical signal line during the time that a current flows in the vertical signal line, resulting in a voltage difference being produced in pixels close to and distant from the load MOS transistor even though the output voltages of the pixels are the same.

A line resistance R becomes about 450 Ω at respective ends of, for example, an aluminum wire having a width of 0.8 μm, a thickness of 0.4 μm and a full length over a pixel region of 4 mm. At that time, insofar as the load MOS transistor has a good constant current characteristic, a current within the pixel is constant and therefore the gain is not changed between the pixels. In order to improve the constant current characteristic, a channel length L is increased and (Vg−Vth) must be reduced where Vg is the gate voltage and Vth is the threshold voltage. In that event, a current $I_L$ is expressed as:

$$I_L = \tfrac{1}{2} \mu_n C_{ox} (Vg - Vth - Vs)^2$$

where $\mu_n$ is the mobility of electron, $C_{ox}$ is the capacitance per unit area of an oxide film and Vs is the source voltage. There is then the problem such that, if (Vg−Vth) is small when Vs=0, then a fluctuated component of the threshold voltage Vth is squared so that the current is changed considerably.

OBJECTS AND SUMMARY OF THE INVENTION

In view of the aforesaid drawbacks, it is an object of the present invention to provide a CCD solid state image sensing device in which the aforesaid shortcomings and disadvantages encountered with the prior art can be eliminated.

More specifically, it is an object of the present invention to provide a CCD solid state image sensing device in which the fluctuation of a threshold voltage of a load MOS transistor connected to the vertical signal line can be reduced so that an aperture ratio can be increased as the vertical signal line is reduced in thickness.

As an aspect of the present invention, a CCD image sensing device in which amplifying transistors for amplifying a photoelectrically-converted signal charge and outputting the amplified signal charge to a vertical signal line is provided at every pixel of a plurality of pixels arrayed in a two-dimensional fashion and a load transistor is connected to each of the vertical signal lines is comprised of a first field effect transistor having a constant current characteristic, and a second field effect transistor acting as a negative feedback resistor function connected in series, the first and second field effect transistors forming the load transistor.

The above and other objects, features, and advantages of the present invention will become apparent from the following detailed description of an illustrative embodiment thereof to be read in conjunction with the accompanying drawings.

DETAILED DESCRIPTION OF THE PREFERRED EMBODIMENT

The present invention will now be described in detail with reference to the accompanying drawings.

Figure 1:
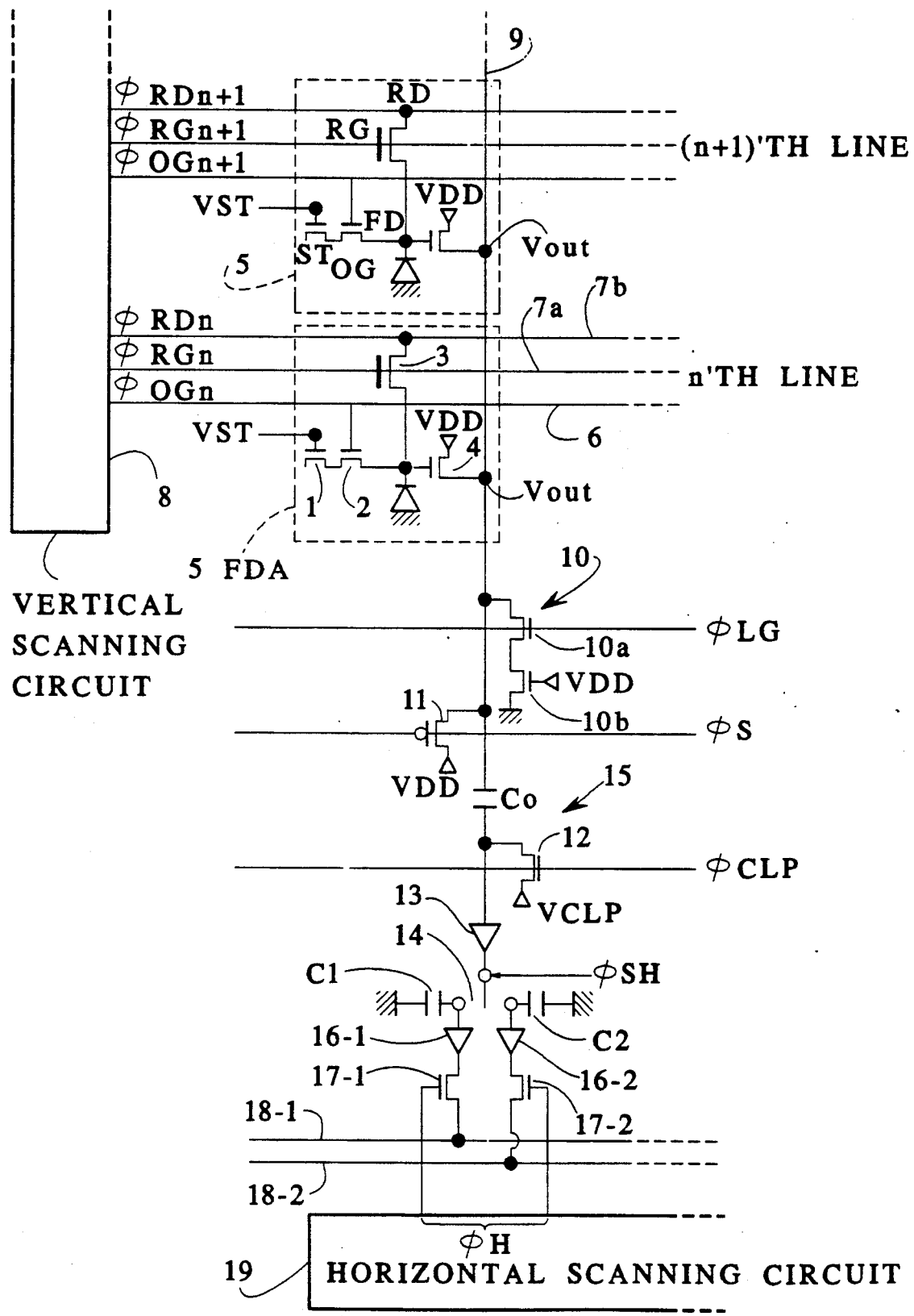
FIG. 1 is a circuit diagram showing a main portion of an embodiment of a CCD image sensing device according to the present invention.

FIG. 1 is a circuit diagram showing a main portion of an embodiment of a CCD solid state image sensing device according to the present invention. Of a plurality of pixels arrayed in a two-dimensional fashion, i.e., in a matrix configuration in the horizontal and vertical directions, only a circuit arrangement of each of the pixels on two adjacent n'th and (n+1)'th lines is illustrated in FIG. 1 for simplicity. The other pixels have the same circuit configuration.

As shown in FIG. 1, when light becomes incident on each pixel, a signal charge corresponding to the incident light is stored in its storage (ST) section 1. The storage section 1 and an output gate (OG) switch 2 constitute a CCD of one bit. Also, a reset MOS-FET (metal oxide semiconductor-field effect transistor) 3 and an amplifying MOS-FET 4 of source follower configuration are formed on the same chip of the CCD. The gate of the amplifying MOS-FET 4 is connected to an FD (floating diffusion) section, thereby a floating diffusion amplifier (FDA) 5 being constructed.

In the floating diffusion amplifier 5, a gate electrode of the output gate switch 2 is connected to an output gate (OG) signal line 6, a gate electrode of the reset MOS-FET 3 is connected to a reset gate (RG) signal line 7a and a reset electrode thereof is connected to a reset drain (RD) signal line 7b, respectively. From a vertical scanning circuit 8, an output gate pulse $\phi_{OG}$ is applied to the gate electrode of the output gate switch 2, a reset gate pulse $\phi_{RG}$ is applied to the gate electrode of the reset MOS-FET 3 and a reset drain pulse $\phi_{RD}$ is applied to the drain electrode thereof, respectively, thereby selecting the horizontal line. A power source voltage $V_{DD}$ is applied to the drain electrode of the amplifying MOS-FET 4 and a source electrode of the MOS-FET 4 is connected to a vertical signal line 9 as an output terminal $V_{OUT}$. When one horizontal line is selected, then signal charges of full pixels of the horizontal line thus selected are amplified by the amplifying MOS-FET 4 and then output to the vertical signal lines 9.

The vertical signal line 9 is connected with a load MOS transistor 10 and a transfer gate switch 11 formed of a P-type MOS-FET and amplified outputs of respective pixels output to the vertical signal line 9 are stored in a noise eliminating capacitor $C_0$ connected thereto. A clamping switch 12 is connected to the output terminal of the capacitor $C_0$ and the clamping switch 12 is turned on when supplied at its gate electrode with a clamping pulse $\phi_{CLP}$, thereby a potential at the output terminal of the capacitor $C_0$ being clamped to a clamp level $V_{CLP}$. The noise eliminating capacitor $C_0$ and the clamping switch 12 constitute a CDS (correlation double sampling) circuit 15 which is adapted to reduce a reset noise involved in the source output of the amplifying MOS-FET 4 or the like.

Figure 2:
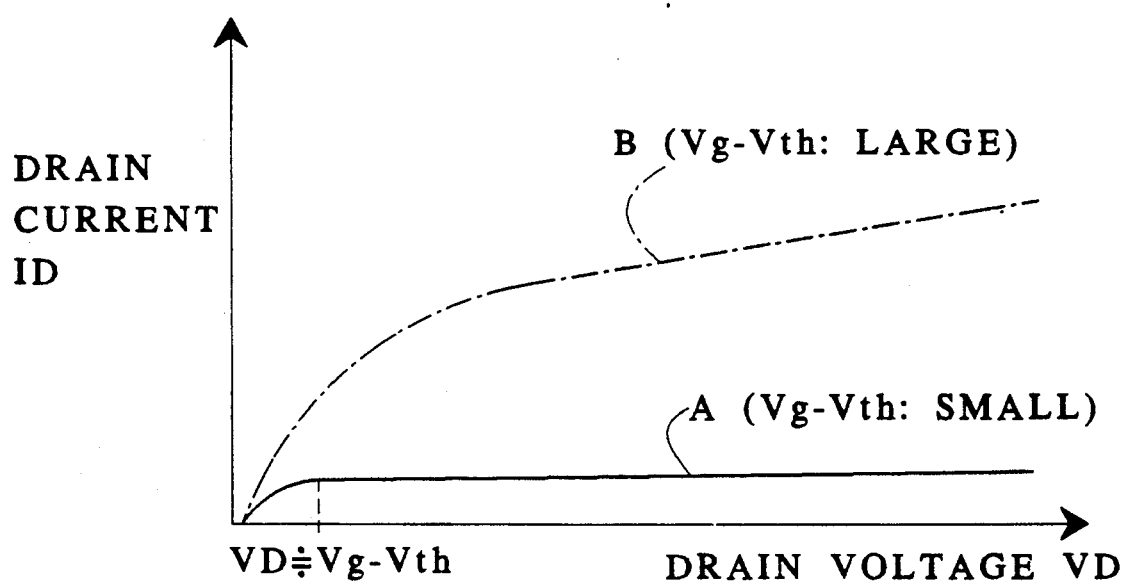
FIG. 2 is a characteristic graph of a constant current of an MOS transistor used therein.

The load MOS transistor 10 is comprised of an MOS-FET 10a and an MOS-FET 10b connected in series between the vertical signal line 9 and the ground. One MOS-FET 10a might be one in which a ratio of W/L between the channel width W and the channel length L is set to be large and (Vg−Vth) is reduced to thereby provide a constant current characteristic shown by a solid line A in FIG. 2. The other MOS-FET 10b might be one in which the ratio, W/L is set to be small and (Vg−Vth) is increased to provide a linear operation shown by a one-dot chain line B in FIG. 2. In the MOS-FET 10b, assuming that $V_D$ represents a drain voltage, then the current I thereof is determined as:

$$I = \mu_n C_{OX} (W/L)(Vg - Vth) V_D$$

Accordingly, the MOS-FET 10b acts as a negative feedback resistor function. Then, a parameter is set by the MOS-FET 10b so as to mainly determine the current. If Vg>Vth, then the CCD solid stage image sensing device of the present invention becomes strong against fluctuations of the threshold voltage Vth.

An output of the noise eliminating capacitor $C_0$ is alternatively supplied through a buffer amplifier 13 to sample and hold capacitors $C_1$ and $C_2$ by a change-over switch 14 and thereby sampled and held by these capacitors $C_1$ and $C_2$. The switching control of the change-over switch 14 is carried out at every line by a sampling-/holding pulse $\phi_{SH}$ generated during the horizontal blanking period, whereby the pixel output of the even line, for example, is held in the capacitor $C_1$ and the pixel output of the odd line is held in the capacitor $C_2$, respectively. The held outputs of the capacitors $C_1$ and $C_2$ are amplified by buffer amplifiers $16_{-1}$, $16_{-2}$, switched by horizontal gate switches $17_{-1}$, $17_{-2}$ and then fed to horizontal signal lines $18_{-1}$, $18_{-2}$, respectively. The switching of the horizontal gate switches $17_{-1}$, $17_{-2}$ is controlled on the basis of a horizontal shift pulse $\phi_H$ output from a horizontal scanning circuit 19.

As described above, since the load MOS transistor 10 connected to each of the signal lines 9 is constructed by the MOS-FET 10a having the constant current characteristic and the MOS-FET 10b acting as a negative feedback resistor function connected in series, the gain can be prevented from being changed between the pixels due to the constant current characteristic of the MOS-FET 10a. Also, since the MOS-FET 10b is strong against fluctuations of the threshold voltage Vth, the vertical signal line 9 can be reduced in thickness and therefore the aperture ratio can be increased more.

As described above, according to the present invention, since the load MOS transistor connected to each of the vertical signal lines is constructed by the MOS-FET having the constant current characteristic and the MOS-FET acting as the negative feedback resistor function connected in series, the load MOS transistor having the excellent constant current characteristic and which is strong against the fluctuation of the threshold voltage Vth is obtained. Therefore, the vertical signal line can be reduced in thickness and accordingly, the aperture ratio can be increased more.

The present invention is not limited to the application of the circuit configuration of the embodiment and can be applied to a wide variety of amplifying type solid state image sensing devices having the load MOS transistor 10 connected to each of the signal lines 9.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. A CCD image sensing device in which an amplifying transistor for amplifying photoelectrically-converted signal charges and outputting the amplified signal to one of a plurality of vertical signal lines is provided at every pixel of a plurality of pixels arrayed in a two-dimensional fashion and load means is connected to each of said plurality of vertical signal lines and selectively connected as a load of said amplifying transistor, in which said load means consists of:
   (a) a first field effect transistor having a constant current characteristic; and
   (b) a second field effect transistor connected in series with said first field effect transistor and acting to provide linear operation.

2. A CCD image sensing device according to claim 1, in which said first field effect transistor has a large ratio W/L where W is its channel width and L is its channel length.

3. A CCD image sensing device according to claim 2, in which said second field effect transistor has a small ratio W/L.

4. A CCD image sensing device according to claim 1, in which said load is connected between the vertical signal line and ground.

5. A CCD image sensing device according to claim 1 further including:
 a correlated double sampling circuit connected to one end of each of said vertical signal lines.

6. A CCD image sensing device according to claim 5 further including:
 a plurality of sampling hold circuits, each of which is connected to the output of the corresponding correlated double sampling circuit for producing each pixel output signal.

* * * * *